United States Patent [19]
Fischer et al.

[11] Patent Number: 6,040,721
[45] Date of Patent: Mar. 21, 2000

[54] DEVICE FOR TRIGGERING AN ELECTROMAGNETIC LOAD

[75] Inventors: Werner Fischer, Heimsheim; Birte Luebbert, Stuttgart, both of Germany

[73] Assignee: Robert Bosch GmbH, Stuttgart, Germany

[21] Appl. No.: 09/019,629

[22] Filed: Feb. 6, 1998

[30] Foreign Application Priority Data

Feb. 8, 1997 [DE] Germany ............... 197 04 808

[51] Int. Cl.$^7$ .................................................. H03K 3/00
[52] U.S. Cl. .......................................... 327/110; 327/427
[58] Field of Search .................................. 327/108, 110, 327/427–434, 540, 541, 543, 181, 139, 168, 177, 304

[56] References Cited

U.S. PATENT DOCUMENTS

| | | | |
|---|---|---|---|
| 4,338,651 | 7/1982 | Henrich | 361/154 |
| 4,588,906 | 5/1986 | Taylor | 327/108 |
| 5,530,385 | 6/1996 | Miettinen | 327/108 |
| 5,796,279 | 8/1998 | Umeda et al. | 327/110 |

FOREIGN PATENT DOCUMENTS

| | | | |
|---|---|---|---|
| 44 26 021 | 1/1996 | Germany | H01F 7/18 |

*Primary Examiner*—Toan Tran
*Attorney, Agent, or Firm*—Kenyon & Kenyon

[57] ABSTRACT

A device for triggering an electromagnetic load. The load is formed by at least two partial inductances. The load can be connected to the ground via a first switching device, and a partial inductance can be connected to the ground via a second switching device. The first switching device is triggered as a function of a voltage measured between the partial inductance and the second switching device.

9 Claims, 2 Drawing Sheets

DEVICE FOR TRIGGERING AN ELECTROMAGNETIC LOAD

BACKGROUND INFORMATION

A device for triggering an electromagnetic load, in particular, a solenoid valve, is described in German Patent No. 44 26 021. The load is formed by two partial inductances. The load can be grounded using a switching means. One partial inductance can also be grounded via a second switching means.

This makes it possible to energize only the partial inductance or the entire inductance of the load. When the switching means is opened, very high voltages are generated at the tie point between the inductance and the switching means due to the inductance of the load. Such voltages may damage the switching means.

It is known that a Zener diode can be connected between the tie point between the switching means and the inductance, as well as the control input of the respective switching means, to protect the switching means.

If the tie point between the total inductance and the switching means that controls the total inductance is now connected to a Zener diode, very high voltages are generated when the switching means is turned off. For this reason, Zener diodes with a suitable dielectric strength are required. These are expensive and their integration in an integrated circuit is difficult.

SUMMARY OF THE INVENTION

An object of the present invention is to provide low-cost protection against voltage surges for the switching means with a device and method for triggering an electromagnetic load.

The device and method according to the present invention have the advantage that the switching means is reliably and inexpensively protected against voltage surges.

DETAILED DESCRIPTION

Figure 1:
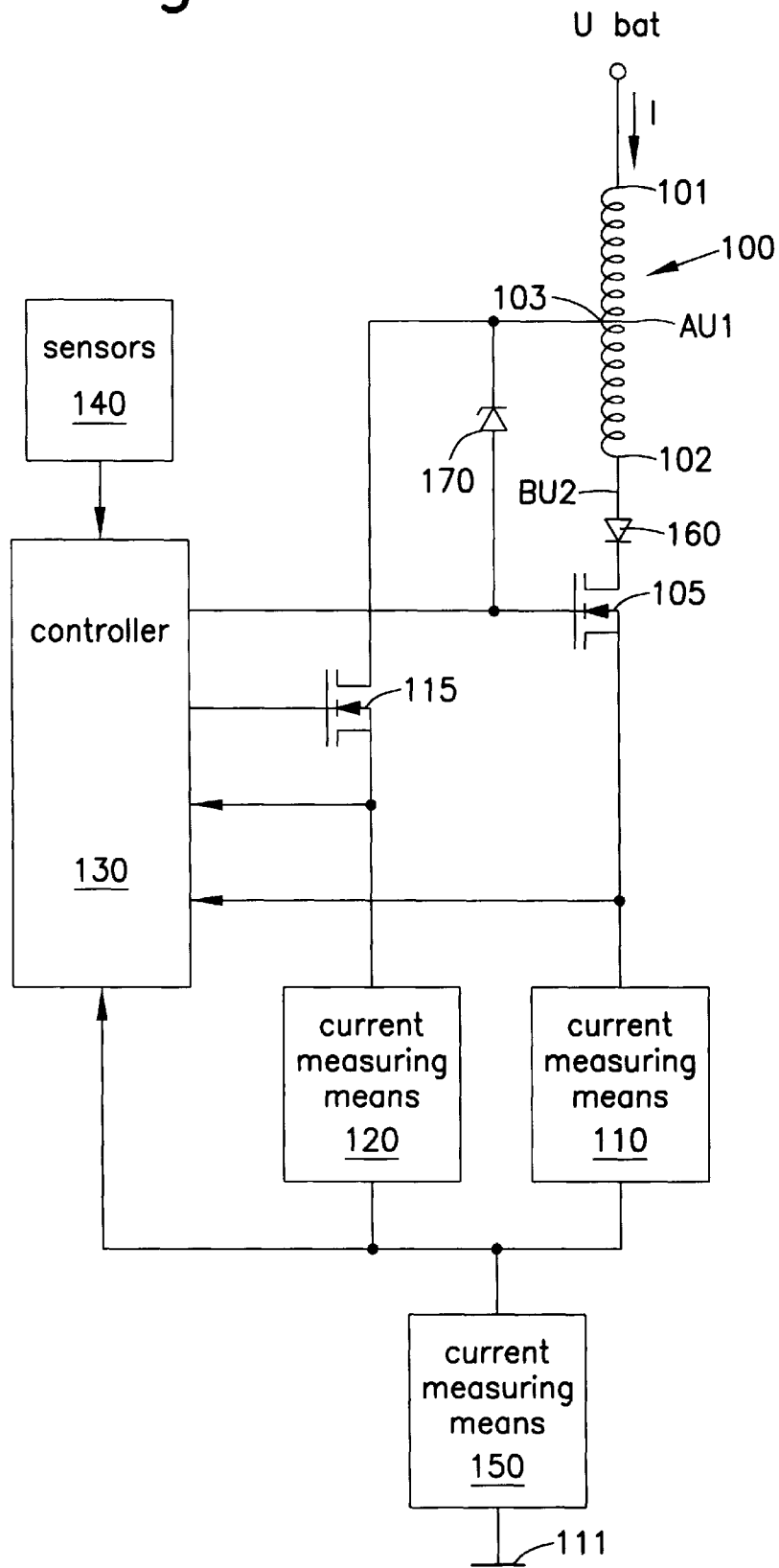
FIG. 1 shows a block diagram of an embodiment of the device according to the present invention.

FIG. 1 schematically shows an embodiment of the device according to the present invention. The electromagnetic load is preferably a coil 100 of a solenoid valve used for metering fuel. The application of the device and the method according to the present invention is not limited, however, to use in fuel metering. It can be used in any electromagnetic load, preferably in motor vehicles, where quick switching takes place when switching on and off.

According to the present invention, coil 100 of the load has three terminals. A first terminal 101 is connected to supply voltage Ubat. The second terminal 102 is connected to ground 111 via a first switching means 105 and a current measuring means 110. The third terminal 103, which is preferably a central tap of the coil, is also connected to ground 111 via a second switching means 115 and an additional current measuring means 120. A controller 130 issues triggering signals for the first and second switching means based on various signals supplied by sensors 140 or other control devices.

The windings between terminals 101 and 103 form a first partial inductance. The current flow can be controlled through this partial inductance using switching means 115. The windings between terminals 102 and 103 form a second partial inductance. The windings between terminals 101 and 102 form the total inductance. The current flow through this total inductance can be controlled using switching means 105.

In addition, controller 130 processes a signal corresponding to the current flowing through current measuring means 110 and 120.

In a particularly advantageous embodiment, only one current measuring means 150 is provided instead of the two current measuring means 110 and 120.

The first and second switching means are preferably implemented as transistors, in particular field-effect transistors.

Current measuring means 110 and 120 are preferably implemented as ohmic resistors with the voltage drop across the two terminals of the resistors used as a signal regarding the currents flowing through the loads. In particular, controller 130 regulates the current flowing over the coils at predefined values. Particularly advantageous is the embodiment illustrated, where a current measuring resistor corresponds to each switching means. This makes it possible to regulate the current flowing to both partial coils at predefined values.

A diode 160 is connected between the second terminal 102 of the coil and the drain terminal of the first switching means 105. This diode is wired so that when switching means 105 is switched through, the diode lets the current pass from the voltage supply to ground 111.

When one of the switching means is opened, the voltage at the tie point between the switching means and the inductance sharply increases. This voltage increase may then damage the switching means.

If a Zener diode is connected between terminal 102 and the control terminal of switching means 105, a Zener diode with a very high dielectric strength must be used in order to achieve the desired voltage values at terminal 102.

If the Zener diode is connected between terminal 103 and the control terminal of switching means 115, the voltage cannot be limited at terminal 102.

In order to limit the voltage at terminal 102 to a value that is greater than that of the Zener diode used, according to the present invention, a Zener diode 170 is connected between the third terminal 103 of coil 100 and the gate terminal of the first switching means 105. This Zener diode 170 is wired so that Zener diode 170 lets the current pass if the voltage at the third terminal 103 exceeds the Zener voltage of Zener diode 170 when the current is switched off.

The tie point between the partial inductance and the switching means controlling the partial inductance is connected, via a Zener diode, to the control terminal of the switching means controlling the total inductance.

This means that the voltage drop across the partial inductance formed by the coil between terminals 101 and 103 is used to control the current flow through the total inductance formed by the coil between terminals 101 and 102.

Figure 2A:
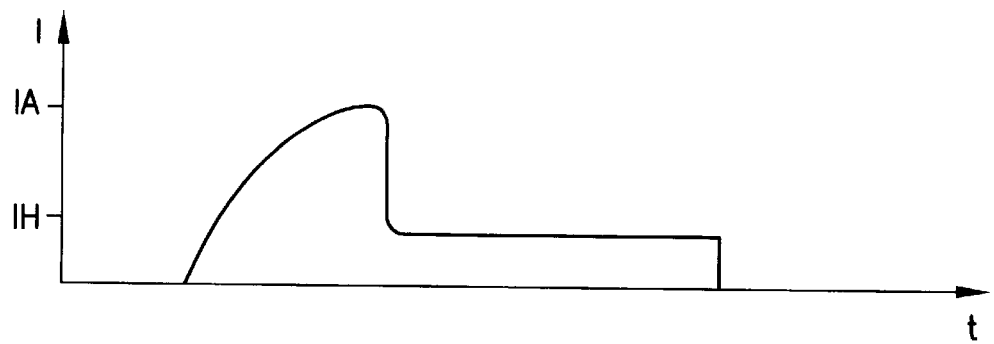
FIG. 2a shows current flowing through the load plotted against time according to the present invention.
Figure 2B:
FIG. 2b shows a first voltage plotted against time according to the present invention.
Figure 2C:
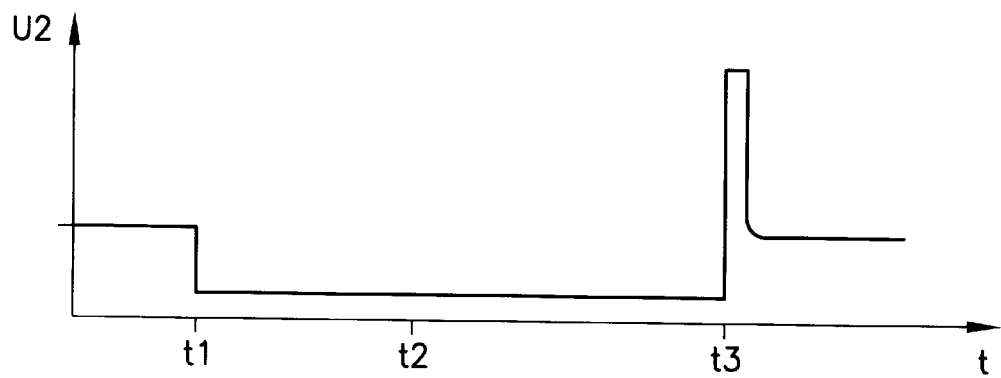
FIG. 2c shows a second voltage plotted against time according to the present invention.

FIGS. 2a, 2b and 2c show a plurality of signals plotted against time t. FIG. 2a shows current I flowing through the load plotted against time t. FIG. 2b shows the variation of voltage U1, measured at the third terminal 103 of the coil. FIG. 2c shows voltage U2 measured at the second terminal 102 of the coil. The variation of fuel injection is shown plotted against time.

The coil is not energized until time t1. This means that both switching means 105 and 115 are open, i.e., the current is zero. The voltages at terminals 102 and 103 are clearly greater than 0.

Triggering of the solenoid begins at time t1. In a first phase up to time t2, preferably only the partial inductance is energized, i.e., only switching means 115 is triggered so that it lets the current pass through the part of the coil between terminals 101 and 103. As a result, current I rises rapidly to its relatively high value, i.e., inrush current IA. Voltage U1 and voltage U2 drop at the same time to a value near 0 with voltage U1 being slightly lower than voltage U2.

At time t2, first switching means 105 is triggered so that it lets the current pass through the entire coil. At the same time, the current is regulated to a lower holding current IH.

At time t3, triggering ends. This means that first switching means 105 is opened again. As a result, voltages U1 and U2 increase sharply. Both voltages rise considerably over the supply voltage Ubat due to the inductance. Since the inductance of the partial coil is less than that of the entire coil, voltage U1 at the third terminal 103 is less than voltage U2 at terminal 102.

When the voltage at terminal 103 reaches Zener voltage UZ of Zener diode 170, the Zener diode becomes conductive, and switching means 105 is triggered so that the voltage at terminal 103 remains at the value UZ. As a result, voltage U2 at terminal 102 also remains at its previous value. Since the inductance of the partial coil is less than that of the entire coil, this voltage is considerably higher than the voltage at terminal 103.

Using Zener diode 170, the voltage at terminal 103 and therefore also at terminal 102 can be set to a constant value, which depends on the Zener voltage of diode 170. The Zener diode picks up the voltage at the partial inductance (terminal 103) and triggers switching means 105, which controls the current flow through the entire inductance. This makes it possible to limit the voltage at terminal 102 to a value that is considerably higher than the breakdown voltage of the Zener diode.

A voltage can be limited to a considerably higher value using an inexpensive and simple Zener diode having a low breakdown voltage. This makes it possible to use considerably less expensive diodes, or diode 170 can even be integrated.

What is claimed is:

1. A device for triggering an electromagnetic load, the load being formed by at least two partial inductances, comprising:

a first switching device for selectively coupling the load to a ground;

a second switching device for selectively coupling at least one of the at least two partial inductances to the ground; and means for triggering the first switching device as a function of a voltage measured at a point between the at least one of the at least two partial inductances and the second switching device.

2. The device according to claim 1, wherein the first switching device allows a current to pass when the voltage at the point reaches a predefined value.

3. A device for triggering an electromagnetic load, the load being formed by at least two partial inductances, comprising:

a first switching device for selectively coupling the load to a ground;

a second switching device for selectively coupling at least one of the at least two partial inductances to the ground; and means for triggering the first switching device as a function of a voltage measured at a point between the at least one of the at least two partial inductances and the second switching device, the means for triggering including a Zener diode coupled between the point and a control terminal of the first switching device.

4. The device according to claim 3, wherein the first switching device is triggered when the voltage measured at the point corresponds to a Zener voltage of the Zener diode.

5. The device according to claim 1, wherein the at least two partial inductances are connected in series.

6. A device for triggering an electromagnetic load, the load being formed by at least two partial inductances, comprising:

a first switching device for selectively coupling the load to a ground;

a second switching device for selectively coupling at least one of that at least two partial inductances to the ground; and a device for triggering the first switching device, the device triggering the first switching device as a function of a measured voltage at a tap between the at least two partial inductances.

7. A device according to claim 6, wherein the device is coupled between the tap and a control input of the first switching device.

8. A device for triggering an electromagnetic load, the load being formed by at least two partial inductances, comprising:

a first switching device for selectively coupling the load to a ground;

a second switching device for selectively coupling at least one of that at least two partial inductances to the ground; and a device for triggering the first switching device, the first switch triggering device triggering the first switching device as a function of a voltage at a tap between the at least two partial inductances, the first switch triggering device including a Zener diode.

9. The device according to claim 6, wherein the at least two partial inductances are in series, and the tap is a center tap.

\* \* \* \* \*